US012762943B2

(12) United States Patent
Okuno et al.

(10) Patent No.: US 12,762,943 B2
(45) Date of Patent: Oct. 13, 2026

(54) PROCESSING APPARATUS, DISPLAY METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Masanori Okuno, Toyama (JP); Junichi Kawasaki, Toyama (JP); Shinichiro Mori, Toyama (JP); Yasuhiro Joho, Toyama (JP); Satomi Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 133 days.

(21) Appl. No.: 18/782,775

(22) Filed: Jul. 24, 2024

(65) Prior Publication Data

US 2024/0378989 A1 Nov. 14, 2024

Related U.S. Application Data

(63) Continuation of application No. 17/882,172, filed on Aug. 5, 2022, now Pat. No. 12,080,149, which is a (Continued)

(30) Foreign Application Priority Data

Mar. 19, 2020 (JP) ................................ 2020-050145

(51) Int. Cl.
*G08B 29/04* (2006.01)
*F27D 21/04* (2006.01)
(Continued)

(52) U.S. Cl.
CPC ............ *G08B 29/04* (2013.01); *F27D 21/04* (2013.01); *G05B 23/027* (2013.01); (Continued)

(58) Field of Classification Search
CPC ............ H01L 21/67766; H01L 21/687; H01L 21/67313; G05B 23/0235; G05B 23/02; G08B 29/04; G08B 21/182; F27B 17/0025
See application file for complete search history.

(56) References Cited

U.S. PATENT DOCUMENTS

2007/0009345 A1* 1/2007 Hall .................. H10P 72/3408 156/345.31
2011/0079177 A1 4/2011 Asai et al.
(Continued)

FOREIGN PATENT DOCUMENTS

JP H07282146 A 10/1995
JP 2011082246 A 4/2011
(Continued)

OTHER PUBLICATIONS

Office Action in corresponding Japanese Patent Application No. 2020-050145, dated Apr. 13, 2021, with English translation.
(Continued)

*Primary Examiner* — Mirza F Alam
(74) *Attorney, Agent, or Firm* — Edell, Shapiro & Finnan, LLC

(57) ABSTRACT

According to one aspect of a technique the present disclosure, there is provided a method of identifying a cause of an abnormality, including: (a) outputting an alarm indicating the failure detected based on sensor information; (b) acquiring a plurality of apparatus data comprising a plurality piece of the sensor information related to the alarm; (c) comparing each of the apparatus data with a threshold value; and (d)
(Continued)

when none of the apparatus data acquired in (b) exceed the threshold value according to a comparison result in (c), identifying a specific apparatus data among the plurality of apparatus data closest to the threshold value as a factor of generating the alarm.

17 Claims, 11 Drawing Sheets

Related U.S. Application Data continuation of application No. PCT/JP2021/004810, filed on Feb. 9, 2021.

(51) Int. Cl.
*G05B 23/02* (2006.01)
*F27B 17/00* (2006.01)
*G08B 21/18* (2006.01)
*H10P 72/10* (2026.01)

(52) U.S. Cl.
CPC ........ *F27B 17/0025* (2013.01); *G08B 21/182* (2013.01); *H10P 72/13* (2026.01)

(56) References Cited

U.S. PATENT DOCUMENTS

2011/0174800 A1* 7/2011 Chino ................. H10P 72/0606 219/446.1
2012/0226475 A1* 9/2012 Asai ................... G05B 19/4184 702/179
2013/0013240 A1* 1/2013 Ikeda ................. G05B 19/4065 702/82
2017/0285613 A1* 10/2017 Asai ..................... G05B 19/406
2019/0035657 A1 1/2019 Asai et al.
2022/0019191 A1* 1/2022 Asai ..................... G05B 19/406

FOREIGN PATENT DOCUMENTS

| | | | |
|---|---|---|---|
| JP | 2011192931 | A | 9/2011 |
| JP | 2012150721 | A | 8/2012 |
| JP | 2012186213 | A | 9/2012 |
| JP | 2017183708 | A | 10/2017 |
| KR | 10-2013-0007608 | A | 1/2013 |
| KR | 10-2017-0113244 | A | 10/2017 |
| TW | 200417945 | A | 9/2004 |
| WO | 2017168676 | A1 | 10/2017 |

OTHER PUBLICATIONS

Office Action in corresponding Japanese Patent Application No. 2020-050145, dated Oct. 4, 2021, with English translation.
Office Action in corresponding Taiwan Patent Application No. 109145909, dated Feb. 8, 2022, with English translation.
Request for the Submission of an Opinion with English translation in Korean Application No. 10-2022-7026648, issued Aug. 14, 2024, 13 pages.

* cited by examiner

201 APPARATUS CONTROLLER

FIG. 6

| ALARM ID | NUMBER OF ITEMS | ANALYSIS ITEM No. | | | | |
|---|---|---|---|---|---|---|
| 000100 | 3 | 15 | 40 | 27 | | |
| 000103 | 2 | 1 | 12 | | | |
| 000104 | 4 | 10 | 15 | 39 | 4 | |
| xxxxxx | | | | | | |

FIG. 7

| ANALYSIS ITEM No. | CAUSE ANALYSIS PROCESS |
|---|---|
| : | : |
| 4 | XXX004() |
| : | : |
| 10 | XXX010() |
| : | : |
| 15 | XXX015() |
| : | : |
| 39 | XXX039() |

FIG. 8

| ANALYSIS ITEM No. | CAUSE RANK |
|---|---|
| 10 | 4 |
| 15 | 1 |
| 39 | 3 |
| 4 | 2 |

PROCESSING APPARATUS, DISPLAY METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 17/882,172 filed on Aug. 5, 2022, which is a bypass continuation application of PCT International Application No. PCT/JP2021/004810, filed on Feb. 9, 2021, in the WIPO, the international application being based upon and claiming the benefit of priority from Japanese Patent Application No. 2020-050145, filed on Mar. 19, 2020, in the Japanese Patent Office, the entire contents of which are hereby incorporated by reference.

TECHNICAL FIELD

The present disclosure relates to a processing apparatus, a display method, a method of manufacturing a semiconductor device and a non-transitory computer-readable recording medium.

BACKGROUND

In the field of semiconductor manufacturing, in order to improve an operating rate or a production efficiency of an apparatus, a trouble of the apparatus may be analyzed or a status of the apparatus may be monitored. As a basic monitoring structure, a structure capable of detecting an abnormality in the apparatus by using a technology such as a statistical analysis technology from information on the apparatus such as a semiconductor manufacturing apparatus may be used in general.

For example, according to some related arts, regarding a production control of the apparatus such as a substrate processing apparatus, a technology (method) of managing a data integrity is disclosed, and a technology of analyzing the abnormality when a data abnormality occurs is disclosed. According to the technologies described above, a management apparatus connected to the substrate processing apparatus is configured to manage an operating state of the substrate processing apparatus. However, with an increase in an amount of data due to a miniaturization of a device such as a semiconductor device, it is preferable that the data is managed in more detail than ever before. Thereby, it becomes difficult for the management apparatus (which is configured to manage a plurality of substrate processing apparatuses) to sufficiently handle the data.

In recent years, there are demands for a production management (or a production control) capable of self-monitoring on the apparatus without increasing a load on a device manufacturer. Therefore, in order to quickly specify (or identify) a cause of the abnormality and to improve the operating rate of the apparatus, various researches are performed by an apparatus manufacturer.

SUMMARY

According to the present disclosure, there is provided a technique (or a configuration) capable of facilitating a troubleshooting after an alarm is issued, reducing a downtime and contributing to a productivity improvement.

According to one or more embodiments of the present disclosure, there is provided a technique related to identifying a cause of an abnormality, including: (a) outputting an alarm indicating the abnormality detected based on sensor information; (b) acquiring a plurality of apparatus data comprising a plurality piece of the sensor information related to the alarm; (c) comparing each of the apparatus data with a threshold value; and (d) when none of the apparatus data acquired in (b) exceed the threshold value according to a comparison result in (c), identifying a specific apparatus data among the plurality of apparatus data closest to the threshold value as a factor of generating the alarm.

BRIEF DESCRIPTION OF THE DRAWINGS

FIG. 6 is a diagram schematically illustrating an example of an alarm analysis table according to the embodiments of the present disclosure.

FIG. 7 is a diagram schematically illustrating an example of an alarm cause investigation table according to the embodiments of the present disclosure.

FIG. 8 is a diagram schematically illustrating an example of a cause rank for each analysis item according to the embodiments of the present disclosure.

DETAILED DESCRIPTION

Embodiments

Figure 1:
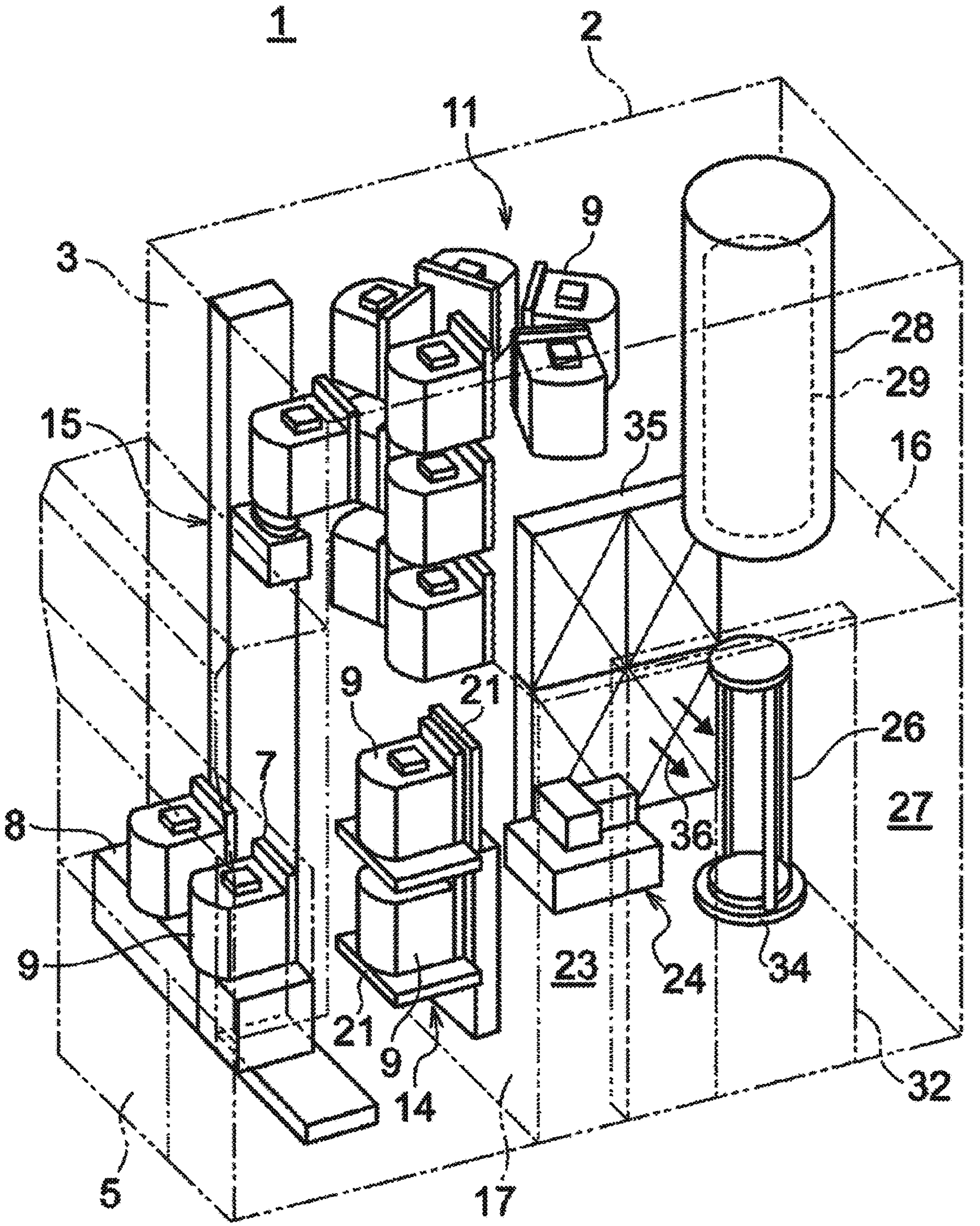
FIG. 1 is a diagram schematically illustrating a perspective view of a substrate processing apparatus preferably used in one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

<Overview of Substrate Processing Apparatus>

Figure 2:
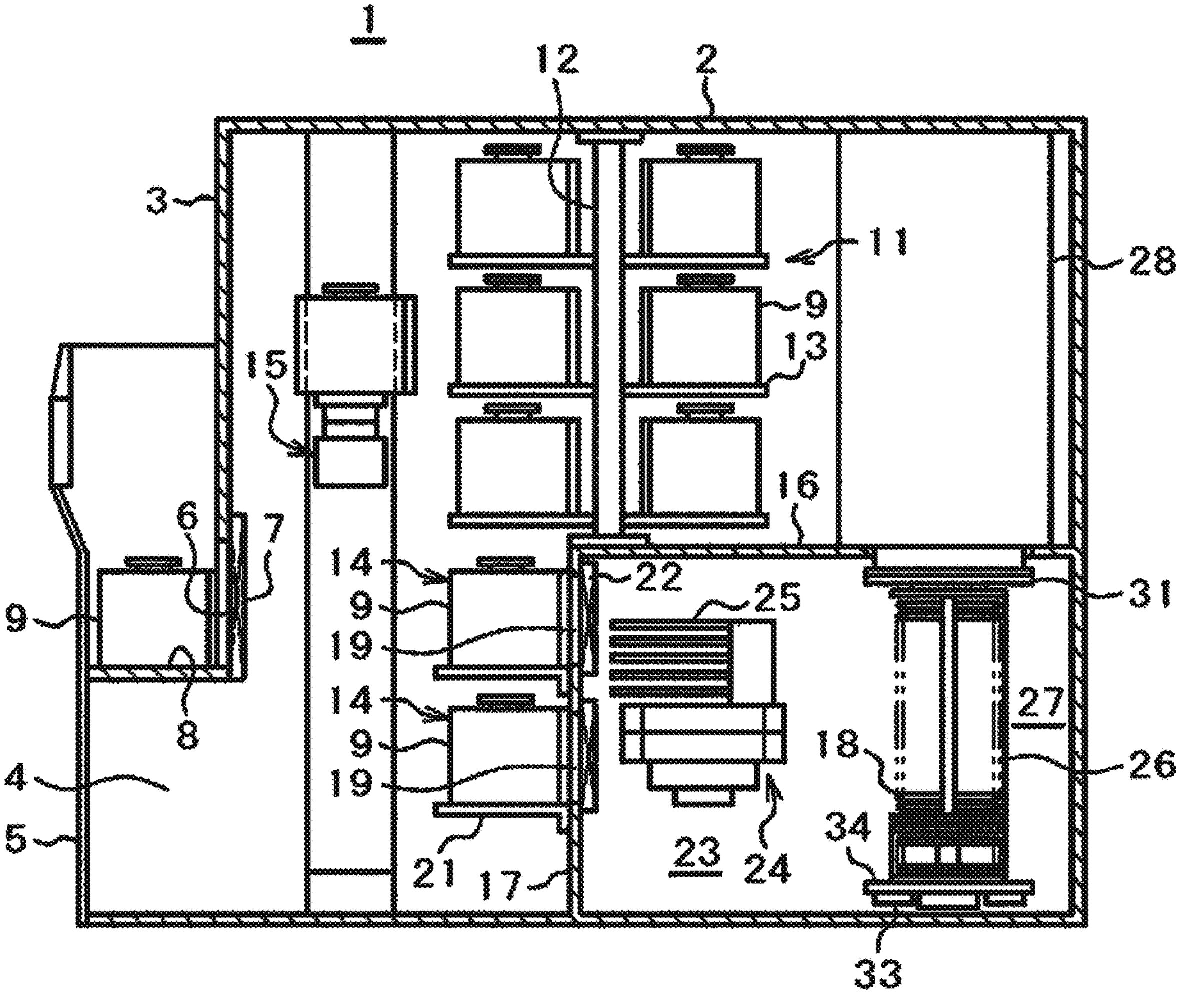
FIG. 2 is a diagram schematically illustrating a cross-section of a side portion of the substrate processing apparatus preferably used in the embodiments of the present disclosure.

First, a substrate processing apparatus 1, which is an example of a processing apparatus in which the technique of the present disclosure is implemented, will be described with reference to FIGS. 1 and 2.

The substrate processing apparatus 1 includes a housing 2. A front maintenance port 4 serving as an opening provided for maintenance is provided at a lower portion of a front wall 3 of the housing 2. The front maintenance port 4 may be opened or closed by a front maintenance door 5.

A pod loading/unloading port 6 is provided at the front wall 3 of the housing 2 so as to communicate with an inside and an outside of the housing 2. The pod loading/unloading port 6 may be opened or closed by a front shutter 7. A loading port (which is a loading port shelf) 8 is provided in front of the pod loading/unloading port 6. The loading port 8 is configured such that a pod 9 is aligned while placed on the loading port 8.

The pod 9 is a sealed type substrate transfer container. The pod 9 may be transferred (or loaded) into and placed on the loading port 8 by an in-process transfer apparatus (not shown) and transferred (unloaded) out of the loading port 8 by the in-process transfer apparatus.

A rotatable pod shelf 11 is provided in the housing 2 to be located over a substantially center portion of the housing 2 in a front-rear direction. The rotatable pod shelf 11 is configured such that a plurality of pods including the pod 9 can be stored (or placed) on the rotatable pod shelf 11. Hereinafter, the plurality of pods including the pod 9 may also be simply referred to as "pods 9".

The rotatable pod shelf 11 includes a vertical column 12 capable of rotating intermittently and a plurality of shelf plates 13. The plurality of shelf plates 13 are configured to be supported (or fixed) radially by the vertical column 12 at positions of an upper portion, a lower portion and a mid portion of the vertical column 12. Each of the plurality of shelf plates 13 is configured to support the pod 9 when the pod 9 is placed thereon.

A pod opener 14 is provided below the rotatable pod shelf 11. The pod opener 14 is provided with a configuration on which the pod 9 is placed and capable of opening and closing a lid (which is a cap) of the pod 9.

A pod transfer structure (which is a container transfer structure) 15 is provided between the loading port 8, the rotatable pod shelf 11 and the pod opener 14. The pod transfer structure 15 is configured such that the pod 9 is capable of being elevated and lowered and being moved forward and backward in the horizontal direction while being supported by the pod transfer structure 15, and such that the pod 9 is capable of being transferred among the loading port 8, the rotatable pod shelf 11 and the pod opener 14.

A sub-housing 16 is provided below the substantially center portion of the housing 2 in the front-rear direction toward a rear end of the substrate processing apparatus 1. A pair of substrate loading/unloading ports 19 configured to load or unload a wafer (hereinafter, also referred to as a "substrate") 18 into or out of the sub-housing 16 is provided at a front wall 17 of the sub-housing 16. The pair of substrate loading/unloading ports 19 is arranged vertically in two stages. A pair of pod openers including the pod opener 14 are provided at the pair of substrate loading/unloading ports 19, respectively. For example, an upper pod opener and a lower pod opener may be provided as the pair of pod openers. The upper pod opener and the lower pod opener may be collectively or individually referred to as the "pod opener 14".

The pod opener 14 may include: a placement table 21 where the pod 9 is placed thereon; and a cap attaching/detaching structure 22 capable of attaching and detaching the lid of the pod 9. The pod opener 14 is configured such that a substrate entrance of the pod 9 is opened or closed by detaching or attaching the lid of the pod 9 placed on the placement table 21 by the cap attaching/detaching structure 22.

The sub-housing 16 defines a transfer chamber 23 fluidically isolated from a space (hereinafter, also referred to as a "pod transfer space") in which the pod transfer structure 15 or the rotatable pod shelf 11 is provided. A substrate transfer structure 24 is provided at a front side portion of the transfer chamber 23. The substrate transfer structure 24 may include a predetermined number of substrate mounting plates (for example, as shown in FIG. 2, five substrate mounting plates) 25 on which a predetermined number of substrates including the substrate 18 are placed. Each of the substrate mounting plates 25 is capable of being moved directly in the horizontal direction, being rotated in the horizontal direction and being elevated or lowered in the vertical direction. The substrate transfer structure 24 is configured such that the substrate 18 can be loaded into or unloaded out of a boat 26.

In a rear region of the transfer chamber 23, a standby space 27 where the boat 26 is accommodated and in standby is provided, and a vertical type process furnace 28 is provided above the standby space 27. A process chamber 29 is provided inside the process furnace 28, and a lower end portion of the process chamber 29 is configured as a furnace opening. The furnace opening is opened or closed by a furnace opening shutter 31.

A boat elevator 32 capable of elevating and lowering the boat 26 is provided between a right end of the housing 2 and a right end of the standby space 27 of the sub-housing 16. A seal cap 34 serving as a lid is horizontally attached to an arm 33 connected to an elevating platform of the boat elevator 32. The seal cap 34 is configured such that the boat 26 can be vertically supported by the seal cap 34, and such that the furnace opening can be airtightly closed by the seal cap 34 while the boat 26 is loaded into the process chamber 29.

The boat 26 is configured such that a plurality of substrates including the substrate 18 are supported on the boat 26 in a horizontal orientation in a multistage manner with their centers aligned with one another. Hereinafter, the plurality of substrates including the substrate 18 may also be simply referred to as substrates 18.

A clean air supply structure 35 is arranged at a position facing the boat elevator 32. The clean air supply structure 35 is constituted by a supply fan and a dustproof filter so as to supply clean air 36 such as an inert gas and a clean atmosphere. A notch alignment device (not shown) serving as a substrate alignment device configured to align a circumferential position of the substrate 18 is provided between the substrate transfer structure 24 and the clean air supply structure 35.

The clean air 36 ejected from the clean air supply structure 35 is circulated in components such as the notch alignment device (not shown), the substrate transfer structure 24 and the boat 26. Thereafter, the clean air 36 is exhausted out of the housing 2 through a duct (not shown), or is ejected again into the transfer chamber 23 by the clean air supply structure 35.

Subsequently, an operation of the substrate processing apparatus 1 will be described.

When the pod 9 is supplied to the loading port 8, the pod loading/unloading port 6 is opened by the front shutter 7. Then, the pod 9 placed on the loading port 8 is transferred (loaded) into the housing 2 through the pod loading/unloading port 6 by the pod transfer structure 15, and is placed on a designated shelf plate among the plurality of shelf plates 13 of the rotatable pod shelf 11. The pod 9 is temporarily stored in the rotatable pod shelf 11. Then, the pod 9 is transferred from the designated shelf plate 13 to the placement table 21 of the pod opener 14 (that is, one of the upper pod opener and the lower pod opener) by the pod transfer structure 15. Alternatively, the pod 9 may be transferred directly from the loading port 8 to the placement table 21 of the pod opener 14.

When the pod 9 is being transferred, the substrate loading/unloading ports 19 are closed by the cap attaching/detaching structure 22, and the transfer chamber 23 is filled with the clean air 36. For example, the transfer chamber 23 is filled with nitrogen gas serving as the clean air 36 such that an oxygen concentration in the transfer chamber 23 is set to 20 ppm or less, which is much lower than an oxygen concentration in the housing 2 (which is an atmospheric atmosphere).

When an end surface of the pod 9 placed on the placement table 21 is pressed against an opening edge of one of the pair of substrate loading/unloading ports 19 of the front wall 17 of the sub-housing 16, the cap attaching/detaching structure 22 detaches the lid of the pod 9 and the substrate entrance of the pod 9 is opened.

When the pod 9 is opened by the pod opener 14 (that is, one of the upper pod opener and the lower pod opener), the substrate 18 is then taken out from the pod 9 by the substrate transfer structure 24, transferred to the notch alignment device (not shown), and aligned by the notch alignment device. Then, by the substrate transfer structure 24, the substrate 18 is transferred (or loaded) into the standby space 27 provided in the rear region of the transfer chamber 23, and loaded (or charged) into the boat 26.

After the substrate 18 is charged into the boat 26, the substrate transfer structure 24 then returns to the pod 9 and transfers a next substrate among the substrates 18 from the pod 9 into the boat 26.

While the substrate transfer structure 24 loads the substrates 18 into the boat 26 through the pod opener 14 (which is one of the upper pod opener and the lower pod opener), another pod 9 is transferred from the rotatable pod shelf 11 by the pod transfer structure 15 to the pod opener 14 (which is the other one of the upper pod opener and the lower pod opener), and the lid of the aforementioned another pod 9 is opened by the other one of the upper pod opener and the lower pod opener.

When the substrates 18 are charged into the boat 26, the furnace opening of the process furnace 28 closed by the furnace opening shutter 31 is opened by the furnace opening shutter 31. Subsequently, the boat 26 accommodating the substrates 18 is elevated by the boat elevator 32 such that the boat 26 is loaded (inserted) into the process chamber 29.

After the boat 26 is loaded, the furnace opening is airtightly closed by the seal cap 34. Further, according to the present embodiments, at this timing (that is, after the boat 26 is loaded), a purge step (also referred to as a "pre-purge step") of replacing an inner atmosphere of the process chamber 29 with the inert gas is performed.

The process chamber 29 is vacuum-exhausted by a gas exhaust structure (which is a gas exhauster) (not shown) such that an inner pressure of the process chamber 29 reaches and is maintained at a desired pressure (vacuum degree). Further, the process chamber 29 is heated to a predetermined temperature by a heater driver (not shown) such that a desired temperature distribution of the process chamber 29 is obtained.

Further, a process gas whose flow rate is controlled to a predetermined flow rate is supplied by a gas supply structure (which is a gas supplier) (not shown), and the process gas comes into contact with a surface of the substrate 18 while flowing through the process chamber 29. Thereby, a predetermined processing such as a substrate processing is performed on the surface of the substrate 18. Further, the process gas after a reaction of the predetermined processing is exhausted from the process chamber 29 by the gas exhaust structure.

After a predetermined process time has elapsed, the inert gas is supplied from an inert gas supply source (not shown) by the gas supply structure, the inner atmosphere of the process chamber 29 is replaced with the inert gas, and the inner pressure of the process chamber 29 is returned to the normal pressure (after-purge step). Then, the boat 26 is lowered by the boat elevator 32 through the seal cap 34.

After the substrate 18 is processed, the substrate 18 and the pod 9 are transferred (unloaded) out of the housing 2 in the order reverse to that of loading the substrate 18 and the pod 9 into the housing 2 described above. Then, an unprocessed substrate 18 is further loaded into the boat 26, and a batch processing of the substrate 18 is repeatedly performed.

<Functional Configuration of Control System 200>

Figure 3:
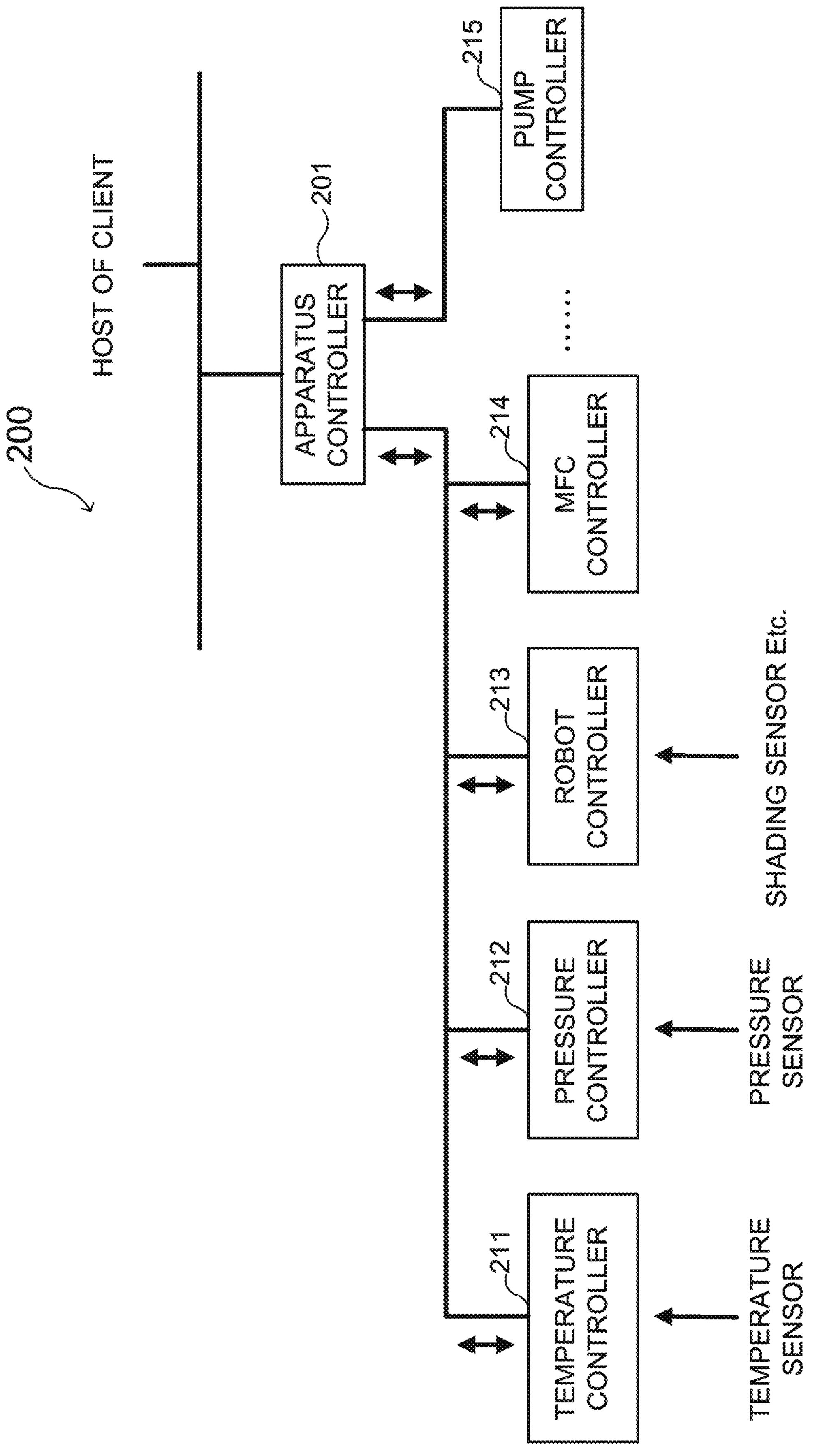
FIG. 3 is a diagram schematically illustrating a functional configuration of a control system preferably used in the embodiments of the present disclosure.

Subsequently, a functional configuration of a control system 200 centered on an apparatus controller 201 serving as an operation structure will be described with reference to FIG. 3. As shown in FIG. 3, the control system 200 includes the apparatus controller 201, a temperature controller 211, a pressure controller 212, a robot controller 213, an MFC controller 214 and a pump controller 215. Further, the apparatus controller 201 functions as a data collection controller. The apparatus controller 201 is configured to collect apparatus data generated by the substrate processing apparatus 1 and to monitor a data integrity of the apparatus data.

According to the present embodiments, the apparatus data may include monitor data generated by an operation of a component constituting the substrate processing apparatus 1 (for example, a component such as a quartz reaction tube, a heater, a valve and an MFC) when the substrate 18 is processed by the substrate processing apparatus 1. For example, the monitor data may include: data (for example, an actually measured value) related to the substrate processing such as a process temperature, a process pressure and the flow rate of the process gas when the substrate processing apparatus 1 processes the substrate 18; data related to a quality of a product substrate (for example, data such as a thickness of a film and an accumulated thickness of the film); and data related to the component constituting the substrate processing apparatus 1 (for example, data such as a pre-set value, an actually measured value, the number of times the component is used and a usage time of the component). The apparatus may further include event data related to various apparatus events generated by the substrate processing apparatus 1. For example, the event data may include alarm information for generating various alarms.

Further, data collected when a recipe is executed may also be referred to as "process data". The process data may include: actually measured value data collected at a predetermined time interval (for example, raw waveform data collected from a start to an end of the recipe at the predetermined time interval such as 1 second); and statistical data created by processing the actually measured value data collected with the predetermined time interval at each step in the recipe. The apparatus data may also include the process data. Further, the statistical data may also include values such as a maximum value, a minimum value and an average value. The apparatus data may also include the event data indicating various apparatus events generated during an idling period when the recipe is not executed (for example, when the substrate 18 is not loaded into the substrate processing apparatus 1). For example, the event data may include data indicating a maintenance history.

For example, the apparatus controller 201 is electrically connected to the temperature controller 211, the pressure controller 212, the robot controller 213, the MFC controller 214 and the pump controller 215 by a LAN (Local Area Network) such as 100 BASE-T. Therefore, each apparatus data can be transmitted or received and each file can be uploaded or downloaded among the apparatus controller 201, the temperature controller 211, the pressure controller 212, the robot controller 213, the MFC controller 214 and the pump controller 215.

For example, the apparatus controller 201 is provided with a port serving as a mounting structure where a recording medium such as a USB memory serving as an external memory is installed or removed. Installed in the apparatus controller 201 is an OS (operating system) corresponding to the port thereof. Further, for example, a host computer or a management apparatus is connected to the apparatus controller 201 via a communication network. Therefore, even when the substrate processing apparatus 1 is installed in a clean room, the host computer can be arranged in a location such as an office outside the clean room. Further, the management apparatus may be configured to be connected to the substrate processing apparatus 1 by a LAN line and to collect the apparatus data from the apparatus controller 201.

The apparatus controller 201 is configured to be capable of collecting the apparatus data, quantifying the operating state of the apparatus and displaying the quantified operating state on a screen. Further, the apparatus controller 201 is configured to be capable of executing each function described later. The apparatus controller 201 will be described later in detail.

A heating structure constituted mainly by the heater and a temperature sensor is connected to the temperature controller 211. The temperature controller 211 is configured to be capable of adjusting an inner temperature of the process furnace 28 by controlling a temperature of the heater of the process furnace 28. Further, the temperature controller 211 is configured to be capable of controlling the electrical power supplied to a heater wire by controlling a switching (which is an on/off control) of a thyristor.

A pressure control structure constituted mainly by a pressure sensor, an APC valve serving as a pressure valve and a vacuum pump is connected to the pressure controller 212. The pressure controller 212 is configured to be capable of controlling an opening degree of the APC valve and a switching (which is an on/off control) of the vacuum pump based on a pressure value detected by the pressure sensor such that the inner pressure of the process chamber 29 reaches a desired pressure at a desired timing.

A robot structure constituted mainly by a shading sensor and a robot is connected to the robot controller 213. The robot controller 213 is configured to be capable of controlling the robot based on sensor information detected by the shading sensor.

The MFC controller 214 is constituted by the MFC (mass flow controller).

Each of the temperature controller 211, the pressure controller 212, the robot controller 213 and the MFC controller 214 is configured to be capable of individually controlling the components related thereto. Further, each of the temperature controller 211, the pressure controller 212, the robot controller 213 and the MFC controller 214 is configured to be capable of reporting a status, an alarm indicating a failure detected based on the sensor information and a value of each sensor connected thereto to the apparatus controller 201 in real time as the monitor data.

A pump structure is connected to the pump controller 215. The pump controller 215 is configured to be capable of controlling the pump structure and capable of reporting an alarm indicating a failure detected based on the sensor information and data such as a pump state, a pump current value, a pump rotation speed and a pump back pressure to the apparatus controller 201 in real time as the monitor data.

According to the present embodiments, each of the apparatus controller 201, the temperature controller 211, the pressure controller 212, the robot controller 213, the MFC controller 214 and the pump controller 215 may be embodied by a general computer system instead of a dedicated system. For example, by installing in the general computer system a program for executing the processing described above from a recording medium such as a flexible disk, a CD-ROM and a USB memory storing the program, each controller described above may be provided to perform a predetermined processing.

Further, a method of supplying the program can be appropriately selected. Instead of or in addition to being supplied through a predetermined recording medium as described above such as the flexible disk, the CD-ROM and the USB memory, for example, the program may be provided through a communication line, a communication network or a communication system. In such a case, for example, the program may be posted on a bulletin board on the communication network, and may be provided by being superimposed on a carrier wave via the communication network. Further, the program provided as described above may be executed to perform the predetermined processing described above under a control of an OS (operating system) of the substrate processing apparatus 1 just like any other application programs.

<Configuration of Apparatus Controller 201>

Figure 4:
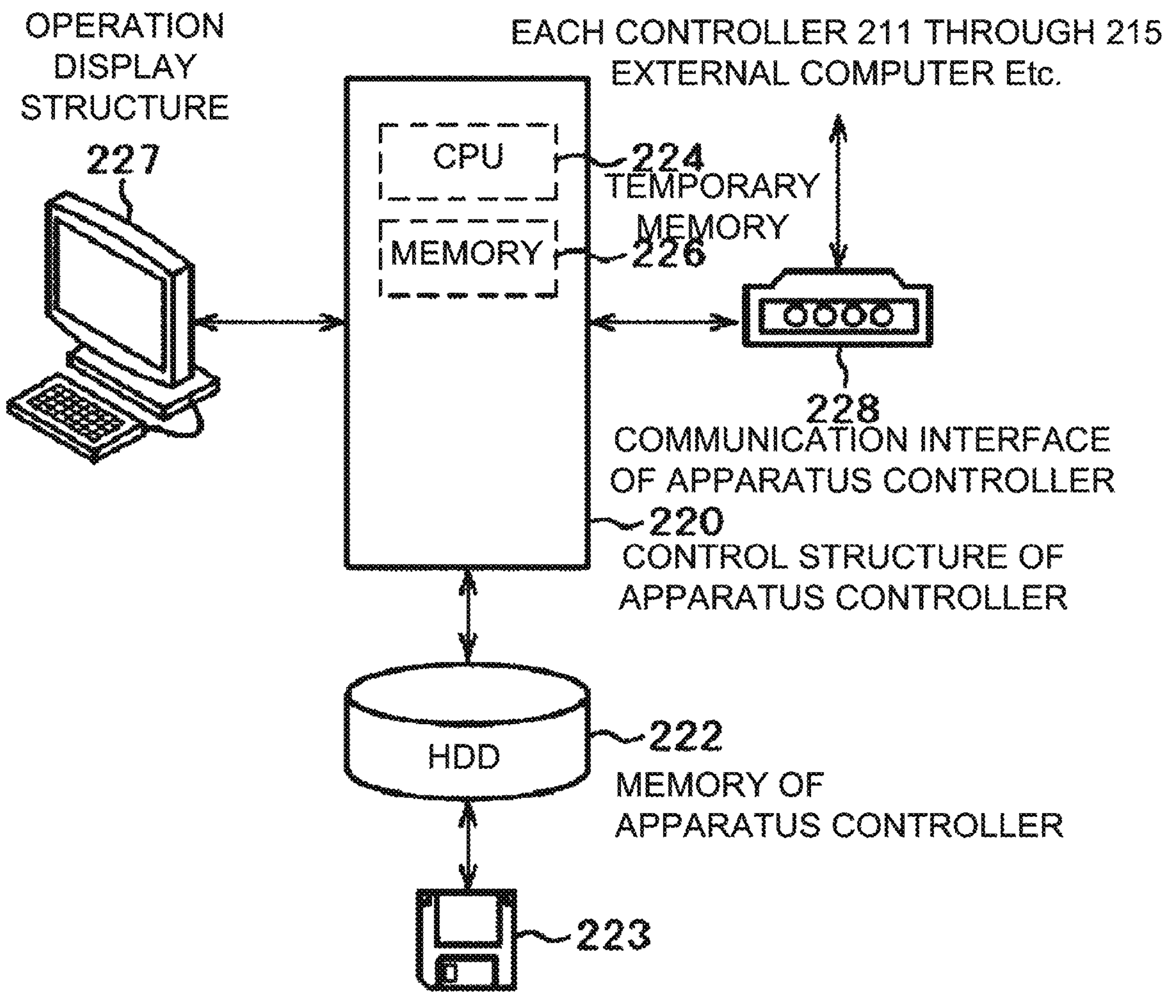
FIG. 4 is a diagram schematically illustrating a functional configuration of an apparatus controller preferably used in the embodiments of the present disclosure.

Subsequently, a configuration of the apparatus controller 201 will be described with reference to FIG. 4.

The apparatus controller 201 may include a control structure 220 of the apparatus controller 201, a memory (which is a hard disk drive ("HDD" shown in FIG. 4)) 222 of the apparatus controller 201, an operation display structure 227 including a display capable of displaying various information and an input structure capable of receiving various instructions from an operating personnel; and a communication interface 228 of the apparatus controller 201 capable of communicating with components inside and outside of the substrate processing apparatus 1. In the present specification, in addition to an apparatus operating personnel, the operating personnel may further include an apparatus manager, an apparatus engineer, a maintenance personnel and a worker. The control structure 220 of the apparatus controller 201 may be embodied by a computer including: a CPU (Central Processing Unit) 224 serving as a processor, a memory 226 such as a RAM (Random Access Memory) and a ROM (Read Only Memory) serving as a temporary memory. The computer constituting the control structure 220 of the apparatus controller 201 may further provided with a clock function (not shown).

In the memory 222 of the apparatus controller 201, a recipe file such as a recipe in which process conditions and process sequences of the substrate processing are defined, a control program file for executing the recipe file, a parameter file in which parameters for executing the recipe are defined, an error processing program file, a parameter file for an error processing, various screen files including an input screen for inputting process parameters and various icon files and the like (which are not shown) are stored.

Further, in the memory 222 of the apparatus controller 201, the monitor data including (or containing) the sensor information output from each controller described above and an alarm history of the alarm indicating the failure detected by each controller based on the sensor information are stored. Further, in the memory 222 of the apparatus controller 201, an alarm analysis table and an alarm cause investigation table, which will be described later, are stored.

Further, on an operation screen of the operation display structure 227, operation buttons serving as the input structure through which an operation instruction to a substrate transfer system or a substrate processing system is input may be provided.

The operation display structure 227 is configured to be capable of displaying the operation screen for operating the substrate processing apparatus 1. The operation display structure 227 is configured to be capable of displaying information on the operation screen of the operation display structure 227, based on the apparatus data generated in the substrate processing apparatus 1 via the operation screen. For example, the operation screen of the operation display structure 227 may be constituted by a touch panel using a liquid crystal display. The operation display structure 227 is configured to receive input data (input instruction) of the operating personnel via the operation screen and to transmit the input data to the apparatus controller 201. Further, the operation display structure 227 is configured to be capable of receiving an instruction (control instruction) for executing a recipe stored in the memory (such as the RAM) 226 and the like or an appropriate substrate processing recipe (also referred to as a "process recipe") among a plurality of recipes stored in the memory 222 of the apparatus controller 201, and capable of transmitting the instruction (control instruction) to the control structure 220 of the apparatus controller 201.

Further, the operation display structure 227 is configured to display the alarm information on the operation screen. The alarm information may include an alarm ID for specifying (or identifying) a type of the alarm indicating the failure detected by the controller among the event data generated in the substrate processing apparatus 1. Further, the operation display structure 227 is configured to receive a cause analysis request for the alarm including the alarm ID by the input data (input instruction) of the operating personnel via the operation screen.

Further, according to present embodiments, the apparatus controller 201 is configured to be capable of reading the apparatus data by loading the screen files and data tables which are stored in advance by executing the various programs and the like when the apparatus controller 201 is started. In addition, the apparatus controller 201 is configured to be capable of displaying each screen (which indicates the operating state of the apparatus) on the operation display structure 227.

The communication interface 228 of the apparatus controller 201 is connected to a component such as a switching hub. The apparatus controller 201 is configured to be capable of transmitting and receiving various data to and from an external computer or another controller (that is, the temperature controller 211, the pressure controller 212, the robot controller 213, the MFC controller 214 and the pump controller 215) in the substrate processing apparatus 1 via a network such as the LAN.

When the control structure 220 of the apparatus controller 201 receives the cause analysis request for the alarm through the operation display structure 227, the control structure 220 of the apparatus controller 201 specifies candidates for analysis items for analyzing a cause of the alarm. Then, the control structure 220 of the apparatus controller 201 acquires the monitor data corresponding to the specified candidates for analysis items from the memory 222 of the apparatus controller 201 in accordance with the number of the candidates listed as the specified candidates, and outputs a display screen for displaying the monitor data corresponding to the specified analysis items to the operation display structure 227.

Further, the apparatus controller 201 transmits the apparatus data such as a state of the substrate processing apparatus 1 to an external host computer via the network (not shown). The substrate processing of the substrate processing apparatus 1 is controlled by the control system 200 based on each recipe file, each parameter file and the like stored in the memory 222 of the apparatus controller 201.

<Substrate Processing Method>

Subsequently, a substrate processing method including a predetermined processing step, which is performed using the substrate processing apparatus 1 according to the present embodiments, will be described. The substrate processing method will be described by way of an example in which the substrate processing such as a film-forming step (which is a part of a manufacturing process of a semiconductor device) is performed.

When performing the substrate processing, for example, the substrate processing recipe (that is, the process recipe) corresponding to the substrate processing to be performed is loaded into a memory such as RAM in the robot controller 213. Then, the operation instruction is appropriately transmitted from the apparatus controller 201 to the robot controller 213. The substrate processing performed in such a manner may include at least a transfer step, a loading step, a film-forming step, an unloading step and a collection step.

<Transfer Step>

The apparatus controller 201 issues a drive instruction for the substrate transfer structure 24 to the robot controller 213. Then, while following the instruction from the robot controller 213, the substrate transfer structure 24 starts a transfer process of the substrate 18 from the pod 9 on the placement table 21 to the boat 26. The transfer process is performed until the substrates 18 scheduled to be loaded into the boat 26 are completely loaded into the boat 26.

<Loading Step>

When the substrates 18 are completely loaded into the boat 26, the boat 26 is elevated by the boat elevator 32 which is operated in accordance with the instruction from the robot controller 213, and is loaded into the process chamber 29 provided in the process furnace 28 (boat loading). When the boat 26 is completely loaded into the process chamber 29, the seal cap 34 of the boat elevator 32 airtightly closes a lower end of a manifold of the process furnace 28.

<Film-Forming Step>

Thereafter, the inner atmosphere of the process chamber 29 is vacuum-exhausted by a vacuum exhaust apparatus such as the vacuum pump (not shown) in accordance with an instruction from the pressure controller 212 such that the inner pressure of the process chamber 29 reaches and is maintained at a predetermined process pressure (vacuum degree). In addition, the process chamber 29 is heated by the heater in accordance with an instruction from the temperature controller 211 such that an inner temperature of the process chamber 29 reaches and is maintained at a predetermined process temperature. Subsequently, the boat 26 and the substrates 18 accommodated in the boat 26 are rotated by a rotator (not shown) in accordance with an instruction from the robot controller 213. While the inner pressure of the process chamber 29 is maintained at the predetermined process pressure and the inner temperature of the process chamber 29 is maintained at the predetermined process temperature, a predetermined gas such as the process gas is supplied to the substrates 18 accommodated in the boat 26 in order to perform the predetermined processing (for example, a film-forming process) to the substrates 18. For example, the process chamber 29 and the vacuum exhaust apparatus may be arranged on the same floor.

<Unloading Step>

After the film-forming step to the substrate 18 accommodated in the boat 26 is completed, the rotation of the boat 26 and the substrates 18 accommodated in the boat 26 is stopped by the rotator in accordance with an instruction from the robot controller 213. Then, the seal cap 34 is lowered by the boat elevator 32 such that the lower end of the manifold is opened. The boat 26 with the processed substrates 18 accommodated therein is then transferred (unloaded) out of the process furnace 28 (boat unloading).

<Collection Step>

Thereafter, the boat 26 with the processed substrates 18 accommodated therein is very effectively cooled by the clean air 36 ejected from the clean air supply structure 35. For example, when the boat 26 is cooled to 150° C. or lower, the processed substrates 18 are transferred (discharged) from the boat 26 to the pod 9. Further, other unprocessed substrates 18 may be transferred to the boat 26.

<Alarm Analysis Process>

Figure 5:
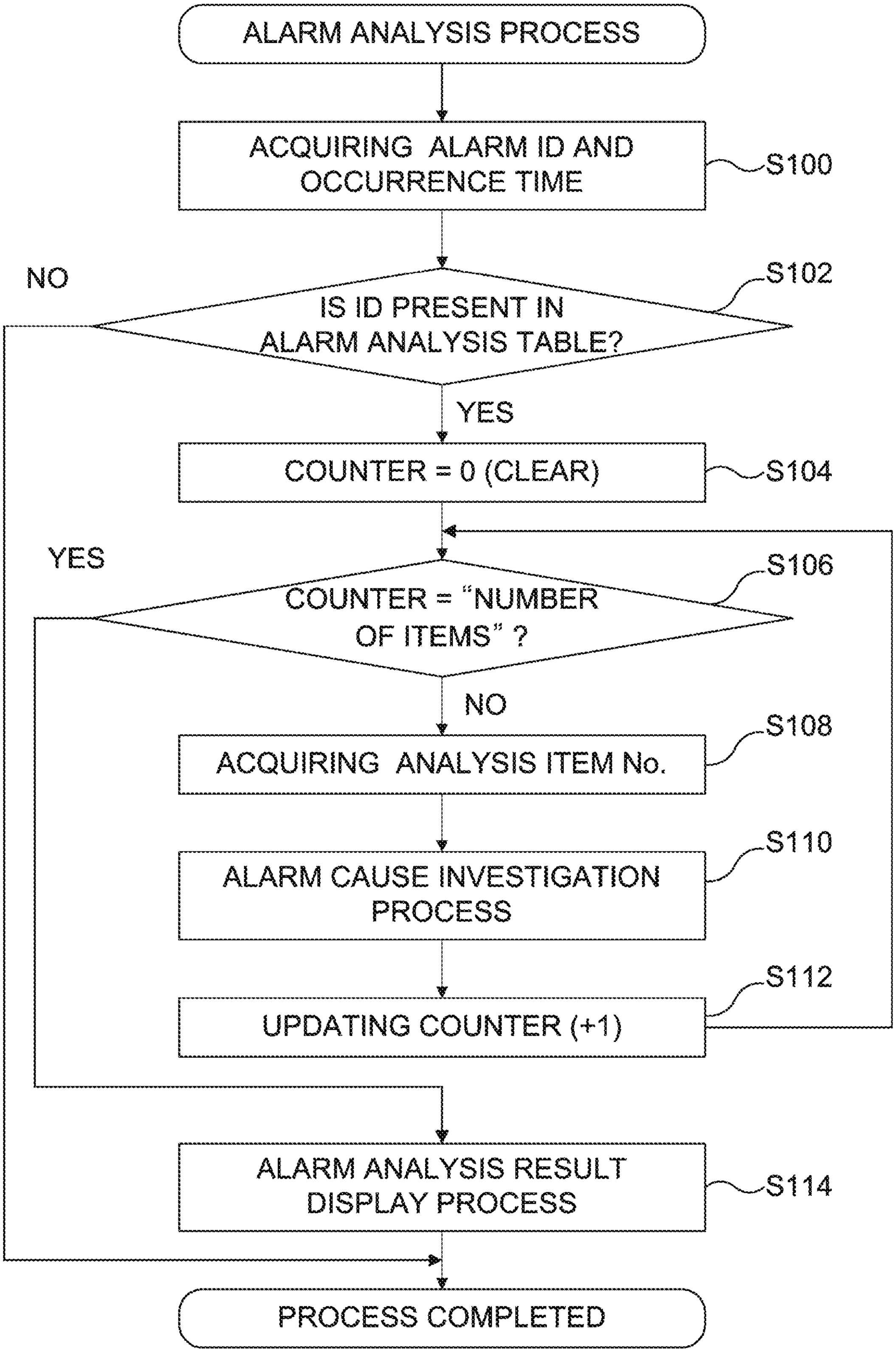
FIG. 5 is a flowchart schematically illustrating a logic of an alarm analysis process according to the embodiments of the present disclosure.

Subsequently, a process flow of an alarm analysis process performed by the apparatus controller 201 will be described mainly with reference to FIG. 5. When a failure such as a malfunction in the component constituting the substrate processing apparatus 1 occurs and the operation of the substrate processing apparatus 1 is stopped, each controller described above detects the failure such as the malfunction based on the sensor information, and outputs the alarm indicating the failure. Then, when the apparatus controller 201 receives the cause analysis request for the alarm including the alarm ID of the alarm, the alarm analysis process is performed.

<Alarm Information Acquiring Step S100>

Figure 13:
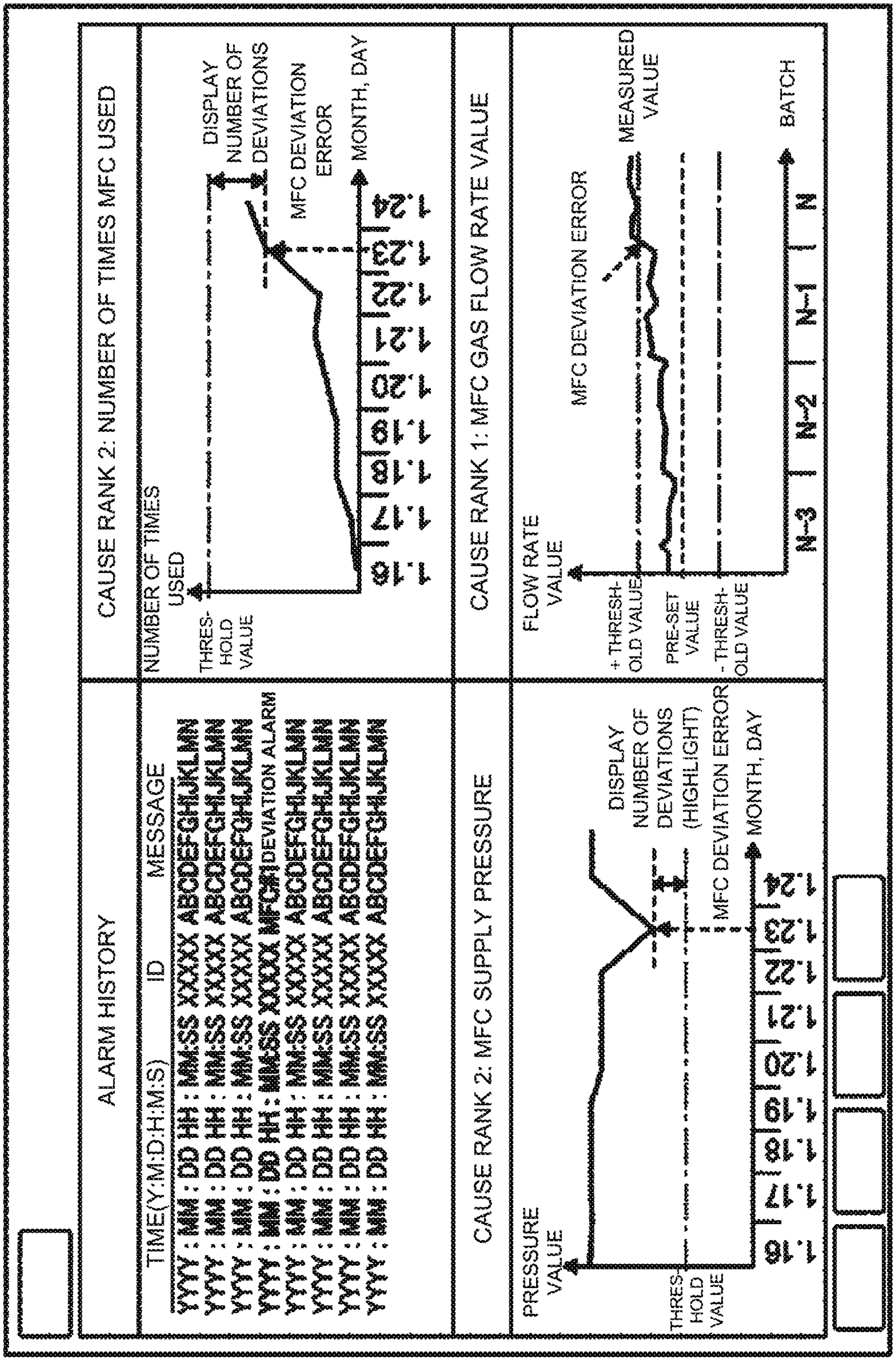
FIG. 13 is a diagram schematically illustrating an example of an alarm history and a display screen for each graph according to the embodiments of the present disclosure.

First, the apparatus controller 201 acquires the alarm ID from the received cause analysis request for the alarm to be analyzed, and further acquires an occurrence time of the alarm corresponding to the acquired alarm ID from an alarm history list table (see FIG. 13) stored in the memory 222 of the apparatus controller 201. In the alarm history list table, for example, the occurrence time of the alarm, the alarm ID and an alarm type are displayed in chronological order. FIG. 13 is a diagram schematically illustrating an example of an alarm history information in which each item of the time (year, month, day, hour, minute and second) when the alarm occurred, the alarm ID and a message (for example, the alarm type) is recorded.

<Alarm Analysis Table Searching Step S102>

Then, the apparatus controller 201 searches for the presence or absence of data related to the alarm ID acquired in the step S100, from the alarm analysis table stored in the memory 222 of the apparatus controller 201.

For example, the alarm analysis table shown in FIG. 6 may be stored in the memory 222 of the apparatus controller 201. In FIG. 6, an example of the alarm analysis table in which the alarm ID ("ALARM ID") for specifying the alarm, the number of items ("NUMBER OF ITEMS") indicating the number of the analysis items used for analyzing the cause of the alarm represented by the alarm ID and analysis item serial numbers ("ANALYSIS ITEM No.") for specifying the analysis items are recorded is illustrated.

When the data related to the alarm ID acquired in the step S100 exists in the alarm analysis table stored in the memory 222 of the apparatus controller 201, the apparatus controller 201 performs a step S104 described below. On the other hand, when the data related to the alarm ID acquired in the step S100 does not exist in the alarm analysis table stored in the memory 222 of the apparatus controller 201, the apparatus controller 201 terminates the alarm analysis process.

<Counter Resetting Step S104>

Then, the apparatus controller 201 clears a value of a counter representing the number of analysis items that have been analyzed, such that the value of the counter is reset to zero (0).

<Counter Determination Step S106>

Then, the apparatus controller 201 determines whether or not the value of the counter matches the "NUMBER OF ITEMS" included in the data searched in the step S102. When the value of the counter matches the "NUMBER OF ITEMS", the apparatus controller 201 performs a step S114 described later. On the other hand, the value of the counter does not match the "NUMBER OF ITEMS, the apparatus controller 201 performs a step S108 described below.

<Analysis Item Serial Numbers Acquiring Step S108>

Then, the apparatus controller 201 acquires the "ANALYSIS ITEM No." included in the data searched in the step S102 one by one.

<Alarm Cause Investigation Process Step S110>

Then, referring to the alarm cause investigation table as shown in FIG. 7 stored in the memory 222 of the apparatus controller 201, the apparatus controller 201 performs a cause analysis process corresponding to the "ANALYSIS ITEM No." acquired in the step S108. Then, the apparatus controller 201 acquires the monitor data corresponding to the "ANALYSIS ITEM No." from the memory 222 of the apparatus controller 201 before and after the occurrence time of the alarm acquired in the step S100.

In FIG. 7, an example of the alarm cause investigation table in which the data related to the cause analysis process for each of the "ANALYSIS ITEM No." is recorded is illustrated. In the data related to the cause analysis process, a process for acquiring the monitor data corresponding to the "ANALYSIS ITEM No." is defined.

<Counter Updating Step S112>

Then, the apparatus controller 201 adds one (1) to the value of the counter representing the number of the analysis items that have been analyzed, such that the counter is updated. Then, the apparatus controller 201 performs the step S106 again.

<Alarm Analysis Result Display Process Step S114>

Then, the apparatus controller 201 displays a display screen on the operation display structure 227. The display screen may include at least a region for displaying the alarm information including the alarm history information acquired in the step S100 and a graph representing the monitor data for each of the "ANALYSIS ITEM No." acquired in the step S110.

When displaying the graph, a threshold value for determining an abnormality related to the monitor data and the time when the alarm is generated are displayed. Further, the threshold value may include a threshold value related to the monitor data and a threshold value related to a deviation from a standard value of the monitor data.

Further, for each of the "ANALYSIS ITEM No.", a cause rank is determined (see FIG. 8), and the determined cause rank is displayed together with the graph. In a process of determining the cause rank, the monitor data of the occurrence time of the alarm is compared with the threshold value, or the deviation of the monitor data of the occurrence time of the alarm from the standard value is compared with the threshold value. In the process of determining the cause rank, when there is an analysis item that exceeds the threshold value, the cause rank of the analysis item is determined to be the first rank ("1" shown in FIG. 8). Further, when there is an analysis item that does not exceed the threshold value but is close to the threshold value, the cause rank of the analysis item is determined to be the second rank ("2" shown in FIG. 8). For analysis items that are not close to the threshold value, the cause rank of the analysis items is determined to be the third rank ("3" shown in FIG. 8) or a lower rank. Further, when none of the analysis items is close to the threshold value, no cause rank is determined for each analysis item.

In FIG. 8, an example in which the cause rank is determined to be the first rank for the analysis item whose "ANALYSIS ITEM No." is "15" and the cause rank is determined to be the second rank for the analysis item whose "ANALYSIS ITEM No." is "4" is illustrated. Further, in the example shown in FIG. 8, the cause rank is determined to be the third rank for the analysis item whose "ANALYSIS ITEM No." is "39" and the cause rank is determined to be the fourth rank for the analysis item whose "ANALYSIS ITEM No." is "10".

First Example

Subsequently, an example in which the alarm analysis table is produced based on a fault tree (also simply referred to as an "FT") factor diagram shown in FIG. 9 will be described. Specifically, FIG. 9 is a diagram schematically illustrating the FT factor diagram when the alarm type (corresponding to the "ALARM CODE CLASSIFICATION") is an alarm based on a gas flow rate deviation error of the MFC (mass flow controller) (hereinafter, also simply referred to as an "MFC deviation alarm").

Figure 9:
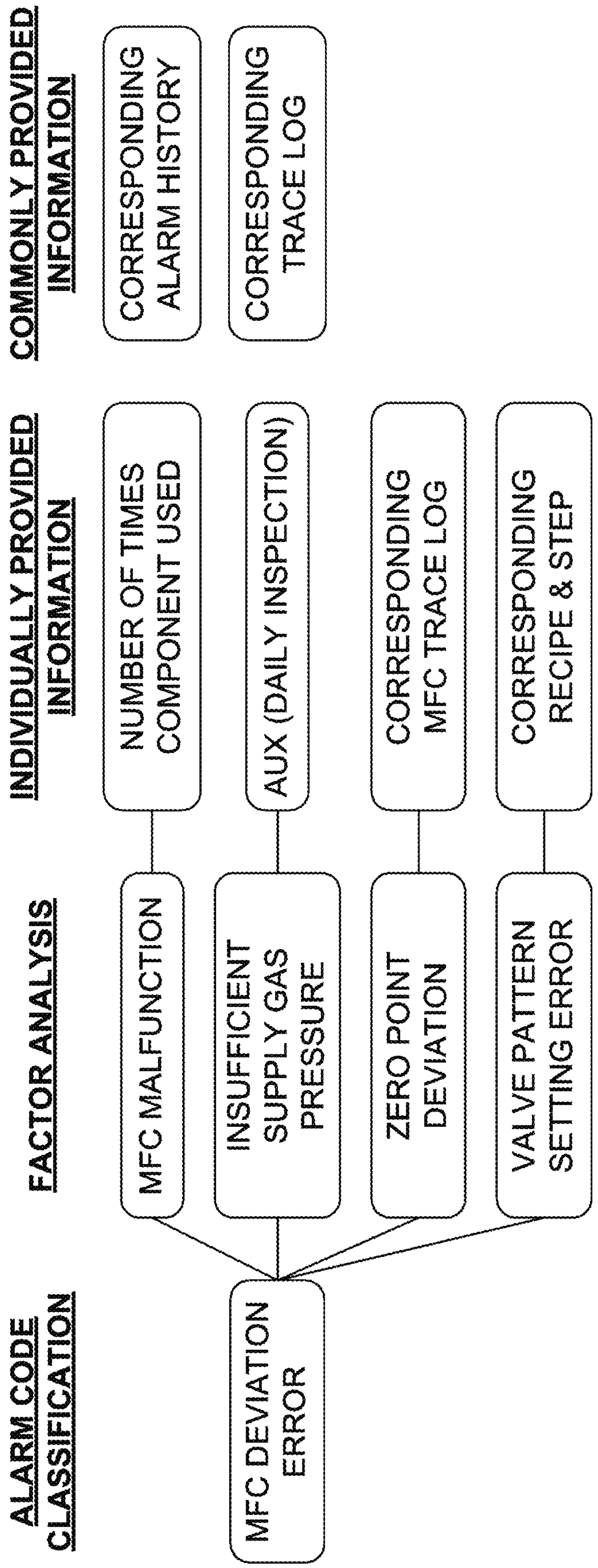
FIG. 9 is a diagram schematically illustrating an example of a fault tree (FT) factor diagram according to the embodiments of the present disclosure.

In FIG. 9, "MFC MALFUNCTION", "INSUFFICIENT SUPPLY GAS PRESSURE", "ZERO POINT DEVIATION" and "VALVE PATTERN SETTING ERROR" are defined for factor analysis when the alarm type is the MFC deviation alarm. As individually provided information for the factor analysis of the MFC deviation alarm, "NUMBER OF TIMES COMPONENT USED" for analyzing the "MFC MALFUNCTION", "AUX (DAILY INSPECTION)" for analyzing the "INSUFFICIENT SUPPLY GAS PRESSURE", "CORRESPONDING MFC TRACE LOG" for analyzing the "ZERO POINT DEVIATION" and "CORRESPONDING RECIPE & STEP" for analyzing the "VALVE PATTERN SETTING ERROR" are defined. In addition, as commonly provided information, "CORRESPONDING ALARM HISTORY" and "CORRESPONDING TRACE LOG" are defined. In the present example, the "commonly provided information" indicates data commonly used for the factor analysis regardless of the alarm type, and the "individually provided information" indicates data used for the factor analysis of a specific alarm type.

In the present example, the "NUMBER OF TIMES COMPONENT USED" may indicate the number of times the MFC is used. The "AUX (DAILY INSPECTION)" may indicate sensor values of a device provided along with the substrate processing apparatus 1) such as a pressure of a supply gas and a flow rate of cooling water, which are not directly related to the processing of the substrate processing apparatus 1.

The "CORRESPONDING MFC TRACE LOG" may indicate a flow rate of the MFC. The "CORRESPONDING RECIPE & STEP" may indicate the pre-set value used for the film-forming process in each of a plurality of steps constituting the process recipe created to perform the film-forming process. For example, the pre-set value may include a value such as a flow rate of the gas, a pressure, a temperature and a control value for the valve in each of the plurality of steps constituting the process recipe. In addition, the pre-set value such as the flow rate of the gas, the pressure, the temperature and the control value for the valve may be displayed on the display screen. Based on such pre-set value, it can be determined whether or not any setting error has occurred in a step in which the alarm is generated.

Further, the "CORRESPONDING ALARM HISTORY" may indicate that an entirety of alarms generated by the substrate processing apparatus 1 are recorded as a history for a certain period of time. In addition, the "CORRESPONDING TRACE LOG" may indicate that data directly related to the film-forming process such as the gas flow rate (a monitored value of the flow rate of the MFC), the pressure (a monitored value of a pressure gauge) and the temperature are recorded in chronological order for a certain period of time.

According to the present embodiments, the memory 222 of the apparatus controller 201 is further provided with a plurality of FT factor diagrams created in advance for each alarm ID. The apparatus controller 201 receives the cause analysis request, and then searches for the FT factor diagram corresponding to the alarm ID included in the cause analysis request, from the memory 222 of the apparatus controller 201. The apparatus controller 201 is configured to be capable of creating the alarm analysis table and the alarm cause investigation table based on the searched FT factor diagram.

Thereby, as the analysis items for the MFC deviation alarm, for example, the number of times the component (the MFC) is used, the pressure value of the supply gas of the MFC and the flow rate of the MFC are determined.

Then, when the cause analysis request for the alarm including the alarm ID of the MFC deviation alarm is received, the following three data are displayed on the screen.

Figure 10:
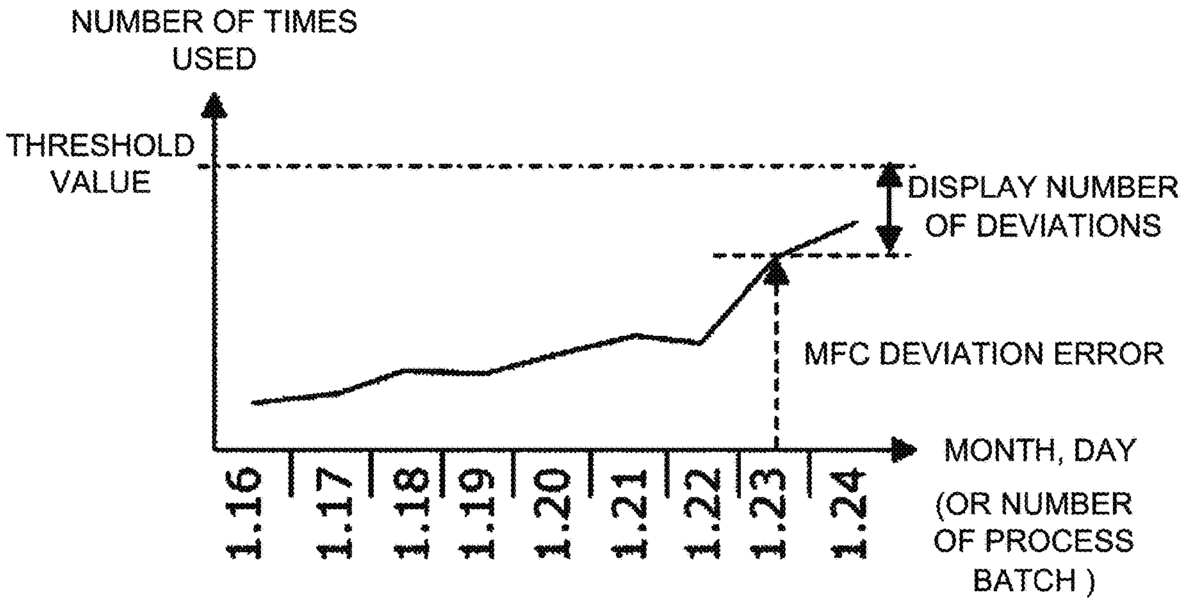
FIG. 10 is a diagram schematically illustrating an example of a graph according to the embodiments of the present disclosure.

First, a graph representing the monitor data of the number of times the MFC is used, as shown in FIG. 10, is displayed. In FIG. 10, for example, a change in an accumulative value of the number of times the MFC is used for each day starting from a first day that antedates the time of the alarm generation by a predetermined time period is displayed together with the time when the alarm is generated, the threshold value for determining the abnormality and the number of deviations from the threshold value. Further, the limit of usage number of the MFC is set as the threshold value, and the number of the deviations from the threshold value is displayed as a remaining number of times up to the limit of usage number. Further, the change in the accumulative value of the number of times the MFC is used may be displayed not for each day but for each process batch. From the graph shown in FIG. 10, it is possible to display a possibility that the MFC has become abnormal before the threshold value is reached.

Figure 11:
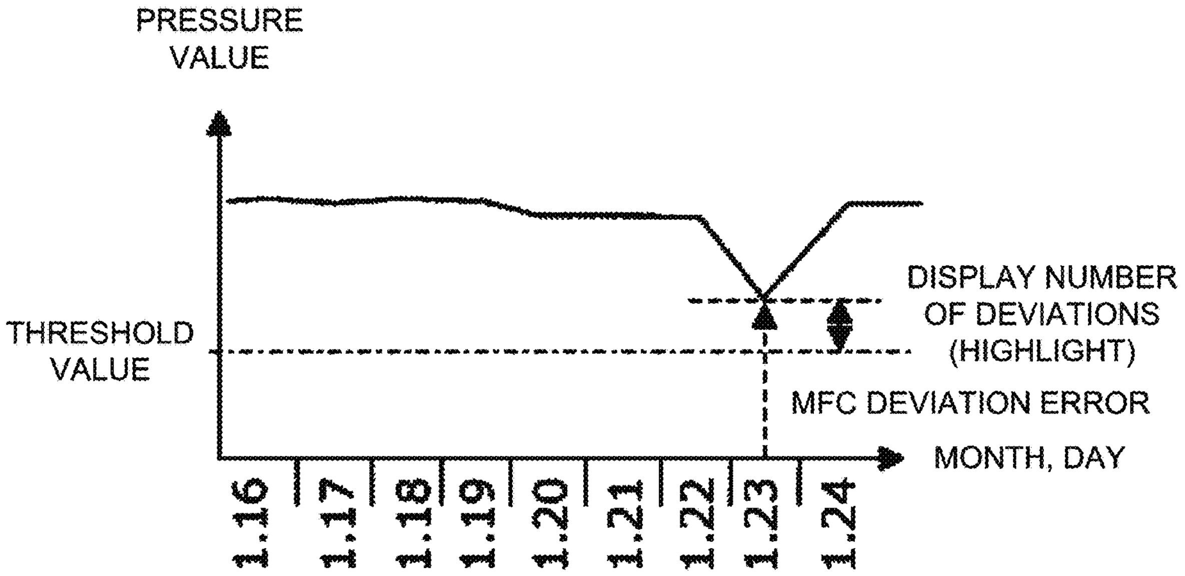
FIG. 11 is a diagram schematically illustrating an example of another graph according to the embodiments of the present disclosure.

Second, a graph representing the monitor data of the pressure value of the supply gas of the MFC, as shown in FIG. 11, is displayed. In FIG. 11, for example, a minimum pressure value of the supply gas of the MFC for each day starting from a first day that antedates the time of the alarm generation by a predetermined time period is displayed together with the time when the alarm is generated, the threshold value for determining the abnormality and a deviation value from the threshold value. Further, a threshold value related to the pressure value of the supply gas of the corresponding MFC is set as the threshold value. Further, the minimum pressure value of the supply gas of the MFC may be displayed not for each day but for each process batch. Further, it may be detected how many pressure values of the supply gas are sufficiently close to the threshold value, and locations thereof may be displayed as a highlight on the graph. From the graph shown in FIG. 11, it is possible to display a possibility that the pressure value of the supply gas may have temporarily decreased due to circumstances of the client's equipment.

Figure 12:
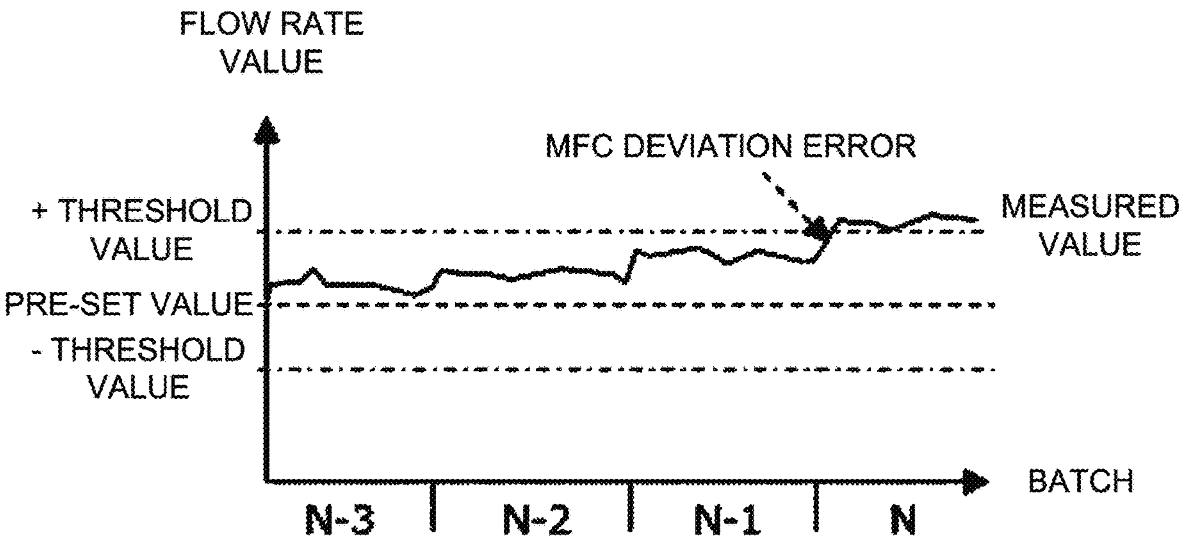
FIG. 12 is a diagram schematically illustrating an example of still another graph according to the embodiments of the present disclosure.

Third, a graph representing the monitor data of the flow rate value of the gas of the MFC, as shown in FIG. 12, is displayed. In FIG. 12, for example, the flow rate value of the gas of the MFC for each process batch starting from a first process batch that precedes the time of the alarm generation by a time period equivalent to a predetermined number of process batches is displayed together with the time when the alarm is generated, the pre-set value and the threshold value for determining the abnormality in accordance with the pre-set value. Further, as the flow rate value of the gas of the MFC, the flow rate of the gas in a step of controlling the corresponding MFC is displayed. From the graph shown in FIG. 12, it is possible to display how much the actually measured value deviates from the pre-set value. Further, it is possible to display that the zero point deviation is gradually accumulated each time the batch process is repeatedly performed, the flow rate value of the gas serving as a base is increased or decreased, and eventually a deviation error occurs.

As described above, from the specified alarm and its occurrence time, the monitor data (one of the gas flow rate, the pressure, the temperature and the like) of the analysis item for the alarm is selected, and using the graph corresponding to the monitor data, the monitor data is displayed from a start time that precedes the time of the alarm generation by a predetermined time period. Thereby, for example, when the alarm is the MFC deviation alarm, it is possible to determine whether the flow rate value of the gas has gradually changed or suddenly changed.

Further, as described above, the threshold value for issuing the alarm is set in advance for each analysis item, and when the monitor data exceeds the threshold value, the alarm related to the analysis item is issued before the MFC deviation alarm. Thereby, the operating personnel can clearly determine a factor for the alarm generation. On the other hand, when the alarm related to the analysis item is not issued, a program analyzes whether there is the actually measured value in the vicinity of the threshold value, and the rank of the analysis items is determined and displayed in descending order of a probability of the abnormality.

For example, as shown in FIG. 13, the analysis item "MFC GAS FLOW RATE VALUE" whose monitor data exceeds the threshold value is determined to be the first rank, the analysis items "NUMBER OF TIMES MFC IS USED" and "MFC SUPPLY PRESSURE" (which do not exceed the threshold value but are close to the threshold value) are determined to be the second rank, and the analysis items described above are displayed.

As described above, even when the threshold value of the alarm is not reached, if there are a plurality of such analysis items as (i) an analysis item that has reached an appropriate value (for example, 90% of the threshold value) determined in advance in relation to the threshold value and (ii) an analysis item recognized as abnormal by the deviation value from the pre-set value exceeding an appropriate value (for example, 80% of the pre-set value) determined in advance, these analysis items may be displayed in the same rank.

Further, when it is highly probable that the entity of the analysis items are the factors for the alarm generation, the entire analysis items may be determined to be the first rank and displayed as such. Alternatively, when it is highly probable that the entity of the analysis items are the factors for the alarm generation, the entire analysis items may be displayed without ranking. By displaying the result that the factors for the alarm generation are insufficient, it is possible to save the operating personnel's wasteful investigation time, and as a result, it is also possible to devote the time to an investigation of unknown factors.

Further, the alarm history list table shown in FIG. 13 includes an occurrence of the MFC deviation alarm of a first MFC ("MFC #1 DEVIATION ALARM" shown in FIG. 13). Further, as shown in FIG. 13, the analysis item "NUMBER OF TIMES MFC USED" and the analysis item "MFC SUPPLY PRESSURE" for the alarm are determined to be the second rank of the factors for the alarm generation, and time series graphs of the monitor data corresponding to the analysis items "NUMBER OF TIMES MFC USED" and "MFC SUPPLY PRESSURE", respectively, are displayed in a region where the apparatus data corresponding to the MFC deviation alarm can be displayed as graphs. As shown in FIG. 13, the analysis item "MFC GAS FLOW RATE VALUE" is determined to be the first rank of the factors for the alarm generation, and a time series graph of the monitor data corresponding to the analysis item "MFC GAS FLOW RATE VALUE" is displayed in the region.

Second Example

Subsequently, an example in which a pressure deviation error is generated will be described.

As the analysis items for a pressure deviation alarm, for example, a pressure value in the process chamber 29, the number of times the APC valve is used and a pump abnormality (for example, the pump current value, the pump rotation speed and the pump back pressure) are determined.

Then, when receiving the cause analysis request for the alarm including the alarm ID of an alarm based on the pressure deviation error (hereinafter, also referred to as the "pressure deviation alarm"), the following three data are displayed on the screen.

Figure 14:
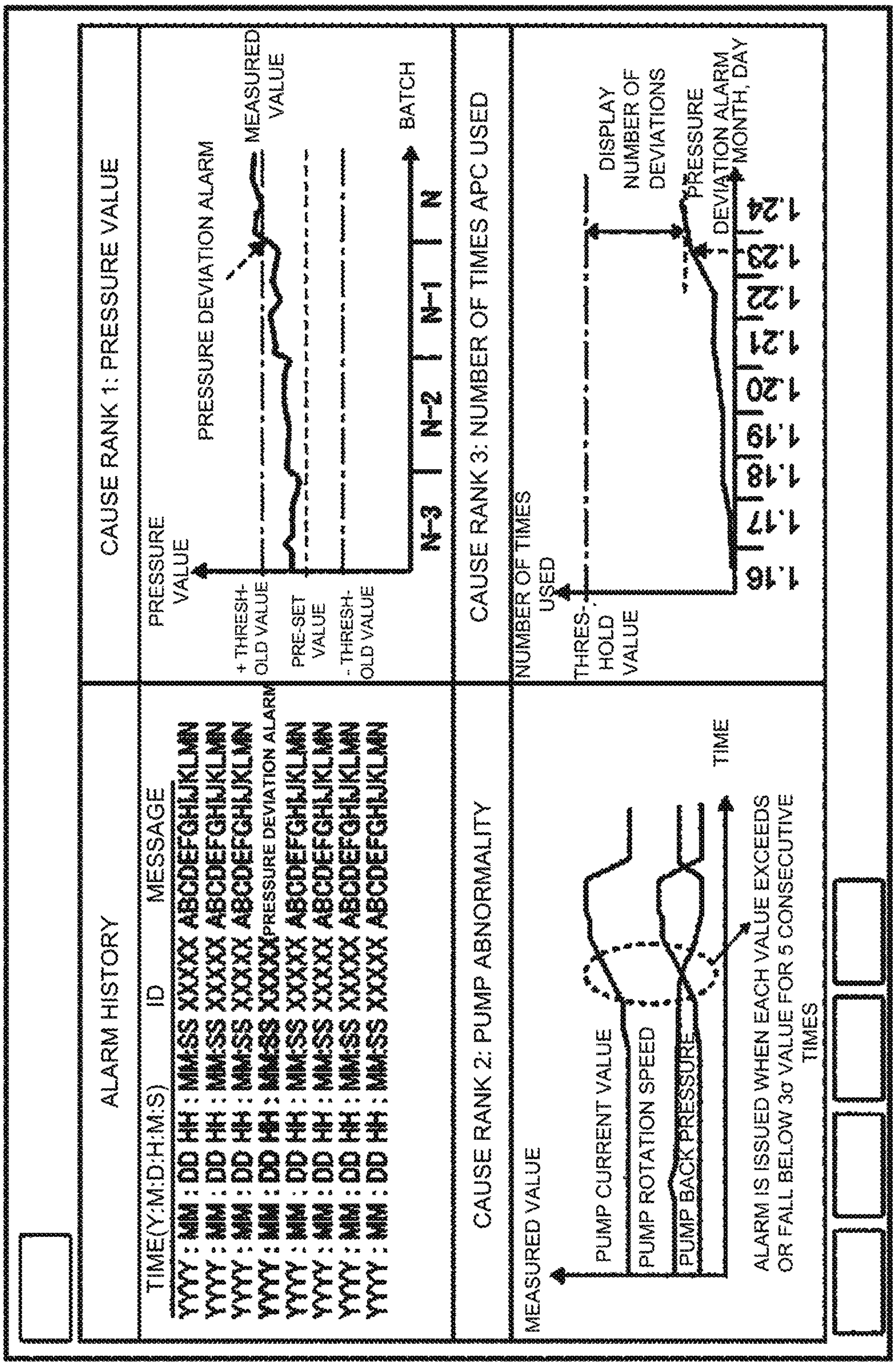
FIG. 14 is a diagram schematically illustrating another example of the alarm history and the display screen for each graph according to the embodiments of the present disclosure.

First, a graph representing the pressure value in the process chamber 29, as shown in FIG. 14, is displayed. In FIG. 14, for example, a change in a minimum pressure value for each process batch starting from a first process batch that precedes the time of the alarm generation by a predetermined time period is displayed together with the time when the alarm is generated, the pre-set value of the pressure value and the threshold value for determining the abnormality in accordance with the pre-set value.

Second, a graph representing the pump current value, the pump rotation speed and the pump back pressure, as shown in FIG. 14, is displayed. In FIG. 14, for example, a change in each value described above at each time starting from a reference time that precedes the time of the alarm generation by a predetermined time period is displayed. Further, the alarm is issued when each of the pump current value, the pump rotation speed and the pump back pressure exceeds the 3σ value five times in a row or falls below the −3σ value five times in a row.

Third, a graph representing the monitor data of the number of times the APC valve is used, as shown in FIG. 14, is displayed. In FIG. 14, for example, a change in an accumulative value of the number of times the APC valve is used for each day starting from a first day that antedates the time of the alarm generation by a predetermined time period is displayed together with the time when the alarm is generated, the threshold value for determining the abnormality and the number of deviations from the threshold value.

Further, the alarm history list table shown in FIG. 14 includes an occurrence of the pressure deviation alarm ("PRESSURE DEVIATION ALARM" shown in FIG. 14). Further, as shown in FIG. 14, for example, the analysis item "PRESSURE VALUE" is determined to be the first rank of the factors for the alarm generation, and a time series graph of the monitor data corresponding to the analysis item "PRESSURE VALUE" is displayed in a region where the apparatus data corresponding to the pressure deviation alarm can be displayed as graphs. As shown in FIG. 14, for example, the analysis item "PUMP ABNORMALITY" is determined to be the second rank of the factors for the alarm generation, and a time series graph of the monitor data corresponding to the analysis item "PUMP ABNORMALITY" is displayed in the region. Further, as shown in FIG. 14, for example, the analysis item "NUMBER OF TIMES APC USED" is determined to be the third rank of the factors for the alarm generation, and a time series graph of the monitor data corresponding to the analysis item "NUMBER OF TIMES APC USED" is displayed in the region.

In the example, by providing information of the pump together with information of the pressure deviation alarm to the operating personnel, a field of view is widened to cover an outer portion of the substrate processing apparatus 1. Thereby, it helps to solve the problem (that is, the alarm) at an early stage.

According to the present embodiments, it is possible to obtain the following effects.

After the apparatus controller issues an alarm in a semiconductor manufacturing apparatus, in order to specify the cause from the alarm, the operating personnel preferably searches and analyzes related events, monitors, alarms and the like. However, such a task relies heavily on a skill level of the operating personnel, and depending on the operating personnel or the contents of the alarm, it is a very time-consuming task. Furthermore with regard to the pump, according to conventional techniques a manufacturer of the semiconductor manufacturing apparatus and a manufacturer of the pump exchange no more than a minimum necessary communication interface. This is because the semiconductor manufacturing apparatus is chosen by the client independently of the pump and is installed at a site of the client also independently of the pump. Therefore, even when a trouble related to an exhaust occurs on the semiconductor manufacturing apparatus, it takes time to solve the trouble caused by the pump or to target the candidates of a cause of the trouble.

Therefore, according to the substrate processing apparatus according to the embodiments of the present disclosure, when the alarm or a warning occurs in the substrate processing apparatus, the candidates for the analysis items that cause the alarm (or the warning) are specified based on the events, the monitors, the alarms and the like accumulated by the apparatus controller, and the candidates are output in descending order of the probability. Thereby, it is possible to eliminate a dependency on the skill level of the operating personnel as much as possible, and it is also possible to perform a troubleshooting in a short time. As a result, it is possible to shorten a downtime of the apparatus, and it is also possible to contribute to a productivity improvement.

Further, it is possible to perform the troubleshooting without depending on the skill level of the operating personnel (or the worker). As a result, it is possible to reduce the downtime of the apparatus, and it is also possible to contribute to the productivity improvement of the substrate processing apparatus. In addition, by managing a trouble of the pump by the substrate processing apparatus as a part of a cause search operation, it is possible to shorten a troubleshooting time.

Further, the substrate processing apparatus according to the embodiments of the present disclosure may include not only the semiconductor manufacturing apparatus but also a processing apparatus of processing a glass substrate such as an LCD (Liquid Crystal Display) device. In addition, the embodiments of the present disclosure can be applied to other substrate processing apparatuses such as an exposure apparatus, a photolithography apparatus, a coating apparatus and a processing apparatus using a plasma.

The entire contents of Japanese Patent Application No. 2020-050145 described above are hereby incorporated in the present specification by reference.

All documents, patent applications, and technical standards described herein are hereby incorporated by reference in the present specification to the same extent as the case where the contents of each of the documents, the patent applications and the technical standards are described in detail or in particular.

The present disclosure is related to a function supporting the analysis of the cause of the alarm generated in the apparatus. The technique of the present disclosure can be applied to various substrate processing apparatuses.

According to some embodiments of the present disclosure, it is possible to facilitate the troubleshooting after the alarm is issued, to reduce the downtime and to contribute to the productivity improvement.

What is claimed is:

1. A method of identifying a cause of an abnormality, the method comprising:

(a) outputting an alarm indicating the abnormality detected based on sensor information;

(b) analyzing, with a controller, a cause of the alarm by acquiring analysis items used for analyzing the cause of the alarm, comprising:

(b1) searching an alarm analysis table with an alarm ID;

(b2) acquiring the number of the analysis items and analysis item serial numbers; and (b3) specifying candidates for an analysis item that causes the alarm;

(c) acquiring a plurality of apparatus data comprising a plurality piece of the sensor information related to the alarm;

(d) comparing each of the apparatus data with a threshold value; and (e) when none of the apparatus data acquired in (c) exceed the threshold value according to a comparison result in (d), identifying a specific apparatus data among the plurality of apparatus data closest to the threshold value as a factor of generating the alarm, wherein two or more of the apparatus data related to the analysis items are acquired in (c), and wherein the alarm analysis table containing at least the analysis items used for analyzing the cause of the alarm is stored, and the alarm analysis table further contains the alarm ID for specifying a type of the alarm; the number of items indicating the number of the analysis items used for analyzing the cause of the alarm represented by the alarm ID; and analysis item serial numbers for specifying the analysis items.

2. The method of claim 1, wherein (b3) comprises acquiring the apparatus data corresponding to the analysis items specified by the analysis item serial numbers of the number defined by the number of the items.

3. The method of claim 1, wherein an alarm cause investigation table, in which a cause analysis process related to the analysis item serial numbers is defined, is further stored, and wherein the cause analysis process based on the analysis item serial numbers corresponding to the alarm ID is acquired in (b).

4. The method of claim 3, wherein the cause analysis process related to the analysis item serial numbers in accordance with the number of the items corresponding to the alarm ID is repeatedly acquired in (b).

5. The method of claim 1, wherein a plurality of FT factor diagrams created in advance for each alarm ID are further stored, and wherein (b) further comprises:

(b4) acquiring an FT factor diagram corresponding to a specified alarm ID among the plurality of FT factor diagrams; and (b5) based on the FT factor diagram acquired in (b4), creating the alarm analysis table and an alarm cause investigation table in which a cause analysis process related to the analysis item serial numbers is defined.

6. The method of claim 1, wherein the alarm outputted in (a) contains an alarm ID for specifying a type of the alarm indicating the abnormality and an occurrence time of the alarm when the abnormality is detected.

7. The method of claim 1, further comprising:

(f) determining a rank of a cause of the alarm in accordance with a difference between each of the apparatus data and the threshold value when at least one of the apparatus data acquired in (c) exceeds the threshold value; and (g) displaying a relationship between each of the apparatus data and the threshold value in chronological order on a display screen.

8. The method of claim 1, wherein, when the alarm is generated and two or more of the apparatus data are related to the alarm in (e), an apparatus data exceeding the threshold value is specified among the two or more of the apparatus data as the factor of generating the alarm.

9. The method of claim 1, wherein the apparatus data containing the sensor information related to a pump for an exhaust is acquired in (c) as an analysis item used for analyzing a cause of the alarm when the alarm is caused by a flawed exhaust control.

10. A processing apparatus comprising:

a process chamber in which a substrate is processed; and the controller configured to be capable of controlling the steps of claim 1.

11. The processing apparatus of claim 10, wherein at least one of the apparatus data is related to an exhaust apparatus configured to exhaust an atmosphere of the process chamber, and comprises one or more data selected from the group consisting of a pump current, a pump rotation speed and a pump back pressure.

12. The processing apparatus of claim 11, wherein the controller is further configured to be capable of issuing the alarm when an average value of at least one data selected from the group consisting of the pump current, the pump rotation speed and the pump back pressure deviates from a pre-set threshold value for a predetermined number of times in a row.

13. The processing apparatus of claim 11, wherein the process chamber and the exhaust apparatus are configured to be capable of being arranged on a same floor.

14. A display method comprising:

the steps (a) to (e) of claim 1;

(f) determining a rank of a cause of the alarm in accordance with a difference between each of the apparatus data and a predetermined threshold value when at least one of the apparatus data acquired in (c) exceeds the threshold value; and (g) displaying the alarm, the rank, and a relationship between each of the apparatus data and the threshold value in chronological order on a display screen.

15. A processing apparatus comprising:

a process chamber in which a substrate is processed; and a controller configured to be capable of:

(a) outputting an alarm indicating an abnormality detected based on sensor information;

(b) analyzing, with the controller, a cause of the alarm by acquiring analysis items used for analyzing the cause of the alarm, comprising:

(b1) searching an alarm analysis table with an alarm ID;

(b2) acquiring the number of the analysis items and analysis item serial numbers; and (b3) specifying candidates for an item that causes the alarm;

(c) acquiring a plurality of apparatus data comprising a plurality piece of the sensor information related to the alarm;

(d) comparing each of the apparatus data with a threshold value; and (e) when none of the apparatus data acquired in (c) exceed the threshold value according to a comparison result in (d), identifying a specific apparatus data among the plurality of apparatus data closest to the threshold value as a factor of generating the alarm, wherein two or more of the apparatus data related to the analysis items are acquired in (c), and wherein the alarm analysis table containing at least the analysis items used for analyzing the cause of the alarm is stored, and the alarm analysis table further contains the alarm ID for specifying a type of the alarm; the number of items indicating the number of the analysis items used for analyzing the cause of the alarm represented by the alarm ID; and analysis item serial numbers for specifying the analysis items.

16. A method of manufacturing a semiconductor device, comprising:

(a) processing a substrate;

(b) outputting an alarm indicating an abnormality detected based on sensor information;

(c) analyzing, with a controller, a cause of the alarm by acquiring analysis items used for analyzing the cause of the alarm, comprising:

(c1) searching an alarm analysis table with an alarm ID;

(c2) acquiring the number of the analysis items and analysis item serial numbers; and (c3) specifying candidates for an item that causes the alarm;

(d) acquiring a plurality of apparatus data comprising a plurality piece of the sensor information related to the alarm;

(e) comparing each of the apparatus data with a threshold value; and (f) when none of the apparatus data acquired in (d) exceed the threshold value according to a comparison result in (e), identifying a specific apparatus data among the plurality of apparatus data closest to the threshold value as a factor of generating the alarm, wherein two or more of the apparatus data related to the analysis items are acquired in (d), and wherein the alarm analysis table containing at least the analysis items used for analyzing the cause of the alarm is stored, and the alarm analysis table further contains the alarm ID for specifying a type of the alarm; the number of items indicating the number of the analysis items used for analyzing the cause of the alarm represented by the alarm ID; and analysis item serial numbers for specifying the analysis items.

17. A non-transitory computer-readable recording medium storing a program that causes, by a computer, a processing apparatus to perform (a) to (f) of claim 16.

* * * * *